United States Patent [19]

Yamaguchi

[11] Patent Number: 4,733,392
[45] Date of Patent: Mar. 22, 1988

[54] FAIL MEMORY EQUIPMENT IN MEMORY TESTER

[75] Inventor: Kazuo Yamaguchi, Sagamihara, Japan

[73] Assignee: Hitachi, Ltd., Tokyo, Japan

[21] Appl. No.: 719,293

[22] Filed: Apr. 3, 1985

[30] Foreign Application Priority Data

Apr. 4, 1984 [JP] Japan ............................... 59-65889

[51] Int. Cl.$^4$ ...................... G01R 31/28; G06F 11/00
[52] U.S. Cl. ....................................... 371/21; 364/900
[58] Field of Search ........................................ 371/21; 364/200 MS File, 900 MS File

[56] References Cited

U.S. PATENT DOCUMENTS 4,369,511 1/1983 Kimura et al. ......................... 371/21
4,414,665 11/1983 Kimura et al. ......................... 371/21
4,541,090 9/1985 Shiragasawa ......................... 371/21
4,628,509 12/1986 Kawaguchi ......................... 371/21

Primary Examiner—Gareth D. Shaw
Assistant Examiner—Christina Eakman
Attorney, Agent, or Firm—Antonelli, Terry & Wands

[57] ABSTRACT

A fail memory equipment has a plurality of memory blocks which can be changed in their combinations serially or in parallel in accordance with the capacity of a memory to be tested, the number of channels to be tested simultaneously and the testing speed. The single fail memory equipment operates in an interleave fetching mode for a high speed test, in a parallel fetching mode for a multi-channel test or in a serial fetching mode for testing a memory of a large capacity, thereby realizing a high speed test, a large capacity memory test and a simultaneous multi-channel test.

1 Claim, 4 Drawing Figures

| ITEM<br>FETCHING MODE | MAXIMUM CAPACITY OF MEMORY UNDER TEST | THE NUMBER OF CHANNELS CARRYING TEST RESULTS | TEST SPEED | THE NUMBER OF MEMORIES BEING TESTED SIMULTANEOUSLY |
|---|---|---|---|---|
| INTERLEAVE I | 1 M BIT | 1CH./2BLOCKS | HIGH SPEED (30ns min) | 8 |
| PARALLEL P | 1 M BIT | 2CH./2BLOCKS | LOW SPEED (60ns min) | 16 |
| SERIAL S | 4 M BIT ≀ 16 M BIT | 1CH./4BLOCKS ≀ 1CH./16BLOCKS | | 4 ≀ 1 |

FAIL MEMORY EQUIPMENT IN MEMORY TESTER

BACKGROUND OF THE INVENTION

1. Field of the Invention

This invention relates to a fail memory equipment in a memory tester especially in the form of an integrated circuit (IC) which improves efficiency and effectiveness of storage of results of testing various types of semiconductor memories.

2. Description of the Prior Art

Japanese Patent Publication No. 13958/82 published on Mar. 20, 1982 discloses a fail memory equipment in an IC memory tester.

In the past, the fail memory equipment typically has a storage capacity which is equal to or larger than that of a memory to be tested. For example, one type of the fail memory equipment has a large capacity by utilizing a plurality of memory blocks each having memory cells of a small capacity which are accessible at a high speed, so as to store results (data) of a tester operating at a maximum test speed. Another type uses a plurality of memory blocks each having memory cells of large capacity and low power consumption which are accessible at a low speed and has a peripheral circuit which is devised to operate in an interleave mode so as to fetch in parallel results (data) of a tester operating at a high speed.

The former type using the high speed memory cells of small capacity is highly evaluated in its increased speed but is disadvantageous in that it needs a great number of memory cells and high power consumption and becomes expensive.

In the latter type, of all the memory cells, cells actually used is decreased in number in proportion to an increase in the number of interleaved stages and the effect of high speed due to the interleave mode cannot lead to an improvement in utilization efficiency of the memory blocks. In addition, as the capacity of a memory to be tested increases and the number of test data carrying channels (multi-channel) increases to meet simultaneous tests of a great number of memories, the number of memory cells must be increased by the multiple of the number of interleaved stages, resulting in an extensively increased hardware scale of the fail memory equipment.

SUMMARY OF THE INVENTION

An object of this invention is to provide fail memory equipment to solve the above prior art problems which can suffice a minimal hardware scale to meet testing of a large capacity memory and simultaneous tests of channels by efficiently storing test results of various types of semiconductor memories into a plurality of memory blocks which can be changed in their combinations in a desired manner.

According to this invention, the fail memory equipment has the plurality of memory blocks which can be changed in their combinations serially or on parallel in accordance with the capacity of a memory to be tested, the number of data channels to be fetched simultaneously and the testing speed, whereby the single fail memory equipment operates in an interleave fetching mode for a high speed test, in a parallel fetching mode for a multichannel test or in a serial fetching mode for testing a memory of a large capacity, thereby realizing a high speed test, a large capacity memory test and a simultaneous multi-channel test.

According to an embodiment of this invention, a fail memory equipment comprises memory means having the same number of memory blocks as input channels through which results of a memory test are inputted to the fail memory equipment; address input means temporarily storing addresses of memory test, for subsequently supplying an address to a corresponding memory block and selecting a memory cell of the corresponding memory block by decoding the address in response to a decode signal; test result input means selecting an input channel carrying the memory test result in response to a mode designation and temporarily storing the memory test result, for subsequently writing the result into a corresponding memory block; serial/parallel control means responsive to the mode designation to produce the decode signal from an address signal sent from the address input means; and clock control means responsive to a test clock and the mode designation to produce a storage instruction clock for the temporary storage of the address of memory test and the memory test result and a write clock for writing the test result into the memory block in accordance with an interleave mode, a serial mode or a parallel mode, whereby the test results obtained at a high speed from a memory being tested through input channels are written in parallel into the respective memory blocks under the interleave mode, the test results obtained at a low speed from a large capacity memory being tested through an input channel are serially written into the respective memory blocks under the serial mode, and the test results obtained from a number of memories being tested simultaneously through input channels are written in parallel into the respective memory blocks under the parallel mode.

DESCRIPTION OF THE PREFERRED EMBODIMENT

Figure 3:
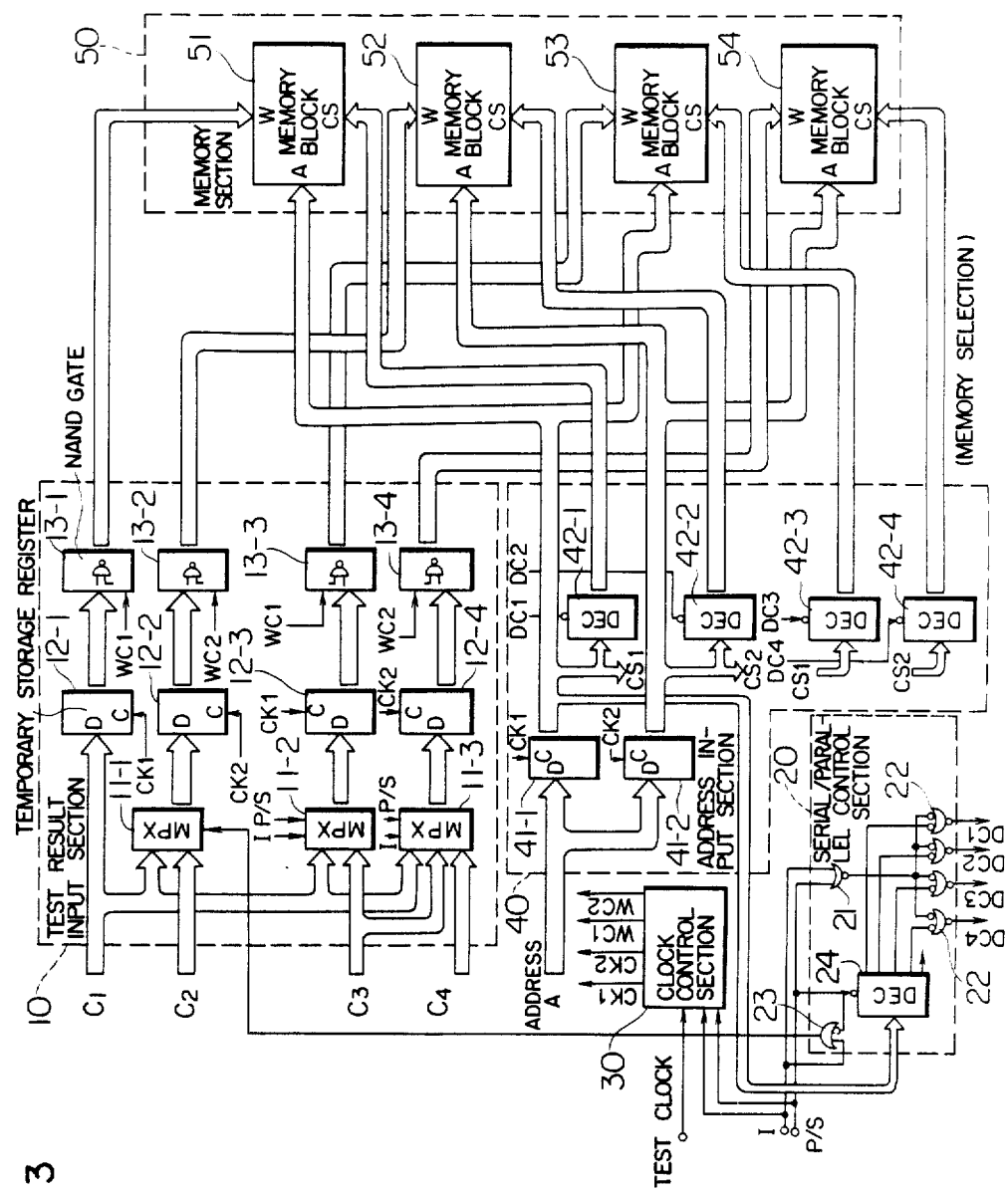
FIG. 3 is a block diagram of a fail memory equipment according to an embodiment of the invention.

Referring now to FIG. 3, a general description of the construction of a fail memory equipment embodying the invention will first be given.

The fail memory equipment comprises a test result input section 10 including multiplexers 11-1 to 11-3, registers 12-1 to 12-4 for temporary storage of test results, and NAND gates 13-1 to 13-4; a serial/parallel control section 20 including control gates 21, 22 and 23, and a decoder 24; a clock control section 30; an address input section 40 including registers 41-1 and 41-2 for temporary storage of addresses, and memory selectors 42-1 to 42-4; and a memory section 50 including a plurality of memory blocks 51 to 54.

Figures 1, 4:
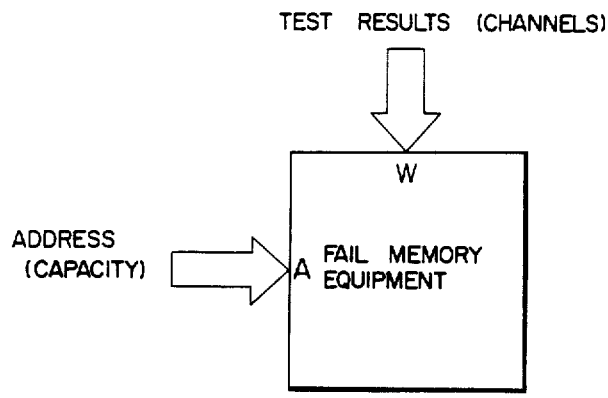
FIG. 1 is a diagram useful in explaining inputting address and data into the fail memory equipment under a general use condition.
FIG. 4 is a table for a comparative explanation of each fetching mode.

As shown in FIG. 1, conditions for inputting addresses and data into the fail memory equipment during testing are determined. Especially, the number of bits of the address input is determined by a capacity of a memory to be tested. For an ordinary memory tester, about 24 bits are prepared for the address input so that the fail memory equipment can handle a memory of 16 M bit capacity at the most.

As for the data input condition, the fail memory equipment has a plurality of memory blocks so that test results of a plurality of memories being tested simultaneously can be inputted to the fail memory equipment through a plurality of input channels. Further, to reduce size and cost of the equipment, each memory block has a plurality of memory cells of low speed and large capacity and is accessed in an interleave mode of two or more ways to follow a maximum test speed of the tester. With an ordinary tester, to avoid an increase in hardware scale and cost of the tester in proportion to increasing test speeds, the capacity of a memory to be tested is about 1 to 4 M bits and the number of memories to be tested is about 4 to 8.

Figure 2:
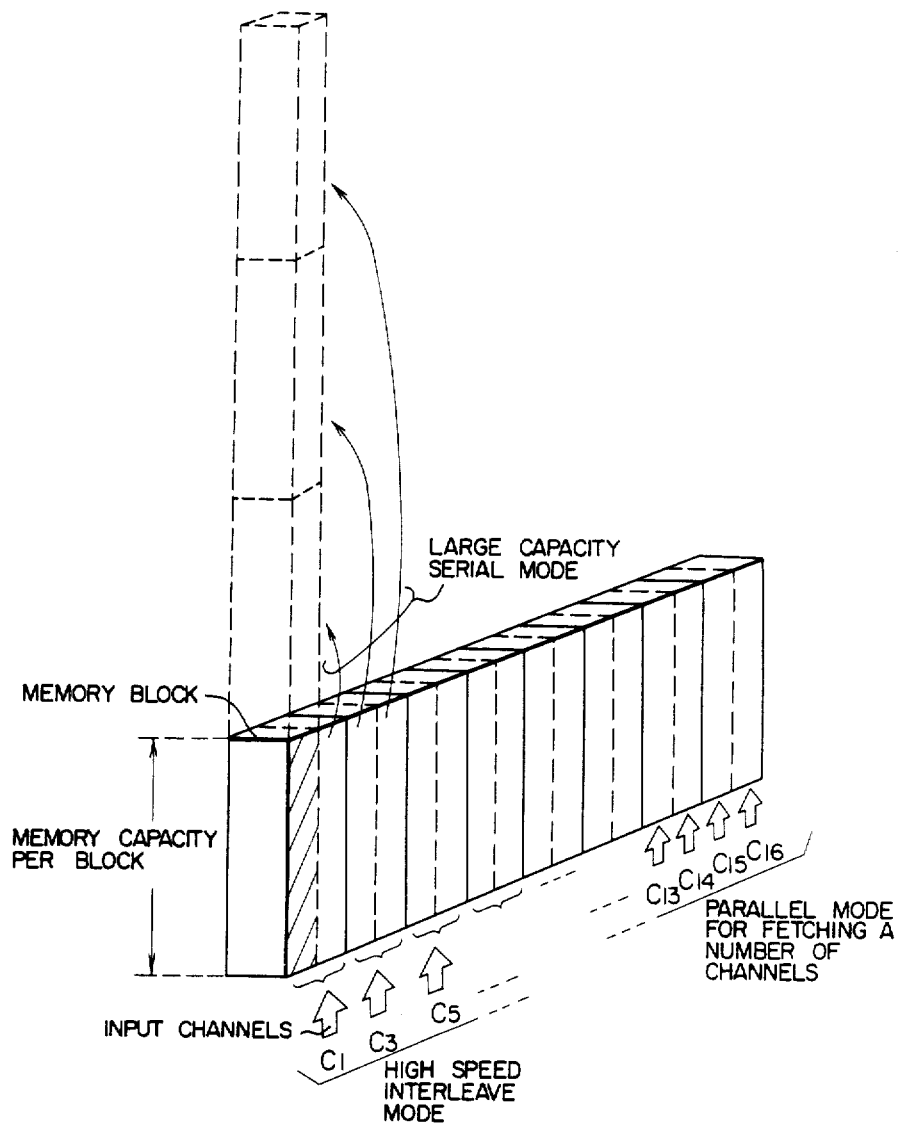
FIG. 2 is a pictorial diagram useful in explaining various forms of use of the fail memory equipment according to the invention.

To meet a test of a large capacity memory, simultaneous tests of a number of memories and a high speed test, the memory blocks of the fail memory equipment of this invention are constructed and used as will be explained with reference to FIG. 2. In a high speed memory test, a high speed interleave mode of two or more ways, exemplarily of two ways herein, is selected wherein two memory blocks are used to fetch test results through, for example, only input channels $C_1$, $C_3$, $C_5$, ..., and $C_{15}$ of all the channels $C_1$ to $C_{16}$; in testing a large capacity memory at a low speed, a large capacity serial mode is selected wherein a plurality of memory blocks (N memory blocks) are serially combined to fetch data, thereby increasing by N a capacity of one equivalent memory block; and in simultaneous tests of a number of memories, a parallel mode for fetching a number of channels is selected wherein test results are inputted in parallel to all the memory blocks in one-to-one correspondent relationship with all the input channels $C_1$, $C_2$, $C_3$, ..., $C_{13}$, $C_{14}$, $C_{15}$ and $C_{16}$.

Referring to FIG. 3, the circuit construction of the fail memory equipment according to an embodiment of the invention which is based on the two-way interleave scheme will be described.

The memory section 50 includes four memory blocks 51 to 54 corresponding to, for example, four input channels $C_1$ to $C_4$. When a defective test result occurs, a write signal W in the form of a pulse signal from the test result input section 10 is inputted to each memory block. An address A indicative of a defective position is supplied from the address input section 40 to each of the memory blocks 51 to 54. A chip select signal CS for selecting a memory cell of each of the memory blocks 51 to 54 is also supplied from the address input section 40 to each memory block, so that a defective test result is stored into each memory block in one-to-one correspondence with an address of a memory to be tested. The input channels $C_3$ and $C_4$ are coupled to the memory blocks in a similar manner to the input channels $C_1$ and $C_2$ except that the channel multiplexer 11-3 is coupled to an additional input channel.

The two input channels $C_1$, $C_2$ or $C_3$, $C_4$ are grouped and operatively associated with the test result input section 10, address input section 40 and memory section 50 in the above description but obviously, three or more input channels may be so grouped.

To efficiently effect the high speed interleave fetching, the large capacity memory serial fetching and the parallel fetching by using the memory blocks, the serial/parallel control section 20 and clock control section 30 are provided.

The operation of the equipment will now be described in accordance with each operation mode. Firstly, in the high speed interleave mode, an interleave mode designation signal I is activated in order that the test result on the input channel $C_1$ can be fetched in parallel by the two memory blocks 51 and 52. The designation signal I enables, via the control gates 21 (NOR gate) and 22 (AND gate) of the serial/parallel control section 20, the memory selectors (decoders) 42-1 and 42-2 which independently select memory cells of the respective memory blocks. On the other hand, the test result on the input channel $C_1$ is selected by the multiplexer 11-1 responsive to the interleave mode designation signal I and hence stored in the temporary storage registers 12-1 and 12-2 responsive to interleave mode storage instruction clocks CK1 and CK2 at the rate of a test cycle (test clock). Similarly, an address of a defective position is stored in the temporary storage registers 41-1 and 41-2. Subsequent to storage of the defective data in the registers 12-1 and 12-2, pulses are produced from the NAND gates 13-1 and 13-2 responsive to write clocks (strobe) WC1 and WC2 from the clock control section 30 to write the defective data into corresponding addresses of the memory blocks 51 and 52.

Similarly, test results on the input channels $C_3$ and $C_4$ are fetched by the memory blocks 53 and 54 under the control of the interleave mode.

In the large capacity memory fetching serial mode, the input channel $C_1$ carrying the test result is selected by the multiplexers 11-1, 11-2 and 11-3 responsive to a serial mode designation signal S and then temporarily stored at the rate of the test cycle or clock in the registers 12-1 to 12-4 responsive at the same timing to the storage instruction clocks CK1 and CK2 from the clock control section 30. The address temporary storage registers 41-1 and 41-2 are also responsive to the clocks CK1 and CK2 at the same timing. The write clock signals WC1 and WC2 are also supplied to the NAND gates 13-1 to 13-4 at the same timing. Since, in this mode, a memory having a capacity larger than that of one memory block is tested, the number of effective input addresses is increased proportionally and inputted to the address input section 40. The increased portion of addresses is decoded by the decoder 24 of the serial/parallel control section 20 only in the serial mode to provide decode signals DC1, DC2, DC3 and DC4 by which the memory selectors 42-1, 42-2, 42-3 and 42-4 corresponding to the respective memory blocks are sequentially enabled so that the test data is serially written into the memory blocks 51, 52, 53 and 54 and stored in an address corresponding to the defective position of the memory being tested.

Finally, in the parallel mode wherein a number of test memories of a memory capacity equal to or smaller than that of the memory block are fetched in parallel, a parallel mode designation signal P is activated and the multiplexers 11-1, 11-2 and 11-3 responsive to the designation signal P select the input channels $C_2$, $C_3$ and $C_4$ carrying the test results in one-to-one correspondence with the memory blocks 52, 53 and 54. Concurrently, the storage instruction clocks CK1 and CK2 from the clock control section 30 are supplied at the same timing to the temporary storage registers 12-1 to 12-4 and 41-1 and 41-2, and the write clocks WC1 and WC2 are also supplied at the same timing to the NAND gates 13-1 to 13-4. The defective data on the input channels $C_1$, $C_2$, $C_3$ and $C_4$ which are not always identical to each other in the parallel mode are stored in the temporary storage registers 12-1, 12-2, 12-3 and 12-4. The memory selectors 42-1, 42-2, 42-3 and 42-4 independently enabled by the parallel mode designation signal P provide memory selection signals CS to the corresponding memory blocks 51, 52, 53 and 54, so that the test data on the channels $C_1$, $C_2$, $C_3$ and $C_4$ are stored in parallel in the memory blocks 51 to 54.

The above operations are summarized in FIG. 4. Assuming that each memory block has a capacity of 1 M bits and 16 memory blocks are used, the single fail memory equipment ensures that 8 memories can be tested simultaneously at a high test speed of 30 nS under the two-way interleave mode, that 16 memories at the most can be tested simultaneously at a low test speed greater than 60 nS under the parallel mode, and that a large capacity memory of a maximum capacity of 16 M bits can be tested under the serial mode.

The two-way interleave scheme described above may be replaced with an interleave scheme of four or more ways to fetch a number of test memories at higher speeds. In this case, the capacity of the memory blocks can be doubled, quadrupled ... to further increase scale and capacity of the equipment.

As has been described, since, according to the invention, the single fail memory equipment can selectively use the various modes meeting testing of the high speed memory and the large capacity memory and simultaneous testing of a number of low speed memories, the efficient and effective utilization of the fail memory equipment can be ensured to improve efficiency and economy of memory test.

What is claimed is:

1. A fail memory equipment comprising:
   memory means having an equal number of memory blocks and input channels through which results of a memory test are inputted to said memory equipment;
   address input means temporarily storing addresses of memory test, for subsequently supplying an address to a corresponding memory block and selecting a memory cell of the corresponding memory block by decoding the address in response to a decode signal;
   test result input means selecting an input channel carrying the memory test result in response to a mode designation and temporarily storing the memory test result, for subsequently writing the memory test result into a corresponding memory block;
   serial/parallel control means responsive to the mode designation to produce the deocde signal from an address signal sent from said address input means; and
   clock control means responsive to a test clock and the mode designation to produce a storage instruction clock for the temporary storage of the address of memory test and the memory test result and a write clock for writing the memory test result into the memory block in accordance with an interleave mode, a serial mode or a parallel mode, whereby the memory test results obtained at a high speed from a memory being tested through input channels are written in parallel into the respective memory blocks under the interleave mode the memory test result obtained at a low speed from a large capacity memory being tested through an input channel are serially written into the respective memory blocks under the serial mode, and the memory test result obtained from a number of memories being tested simultaneously through input channels are written in parallel into the respective memory blocks under the parallel mode.

* * * * *